United States Patent
Choi

[19]

[11] Patent Number: 5,959,486
[45] Date of Patent: Sep. 28, 1999

[54] ADDRESS TRANSITION DETECTION CIRCUIT

[75] Inventor: Kyun-Kyu Choi, Seoul, Rep. of Korea

[73] Assignee: LG Semicon Co., Ltd., Choongcheongbuk-Do, Rep. of Korea

[21] Appl. No.: 08/995,540

[22] Filed: Dec. 22, 1997

[30] Foreign Application Priority Data

Jun. 19, 1997 [KR] Rep. of Korea ............. 97-25677

[51] Int. Cl.⁶ .................... H03K 3/033; H03K 5/22
[52] U.S. Cl. ............................. 327/228; 327/24
[58] Field of Search .................. 327/227, 228, 327/34, 36, 175, 50, 77, 78, 80, 81, 88, 24, 26; 365/233.5

[56] References Cited

U.S. PATENT DOCUMENTS

| | | |
|---|---|---|
| 4,592,028 | 5/1986 | Konishi ............................ 365/230 |
| 5,003,513 | 3/1991 | Porter et al. .................. 365/230.08 |
| 5,198,708 | 3/1993 | Gillingham ...................... 307/480 |
| 5,319,607 | 6/1994 | Fujii et al. ....................... 365/233.5 |
| 5,343,082 | 8/1994 | Han et al. ......................... 307/234 |
| 5,625,604 | 4/1997 | Kim et al. ....................... 365/233.5 |
| 5,706,246 | 1/1998 | Choi et al. ...................... 365/233.5 |
| 5,734,282 | 3/1998 | Choi et al. ........................... 327/227 |

*Primary Examiner*—Toan Tran
*Attorney, Agent, or Firm*—Morgan, Lewis & Bockius LLP

[57] ABSTRACT

An address transition detection circuit includes an address input unit; a first latch unit for latching an input address signal and activating an address transition detection signal; a second latch unit for latching an input level of the first latch unit at a first value in accordance with an output from the first latch unit while the address transition detection signal ATD is active; first and second delay units for delaying an output from the first latch unit; and a CMOS flip-flop for outputting the address transition detection signal having a predetermined width in accordance with outputs from the first latch unit and the first and second delay units.

10 Claims, 5 Drawing Sheets

ADDRESS TRANSITION DETECTION CIRCUIT

This application claims the benefit of Korean Application No. 25677/1997, filed on Jun. 19, 1997, which is hereby incorporated by reference.

BACKGROUND OF THE INVENTION

1. Field of the Invention

The present invention relates to a circuit, and in particular, to an improved address transition detection circuit.

2. Description of the Related Art

As shown in FIG. 1, the conventional address transition detection circuit includes a NOR-gate 10 for operating on an input address AD and a chip selection signal CSb, a latch unit 20 for latching the output from the NOR-gate 10, delay units 30 and 40 for delaying the output from the latch unit 20, and a CMOS flip-flop 50. The CMOS flip-flop 50 is operated by the output from the latch unit 20 for outputting an address transition detection signal ATD in accordance with the outputs from the delay units 30 and 40.

The latch unit 20 includes two input NAND-gates ND1 and ND2 for receiving the inverted output from the NOR-gate 10 and the output from the NOR-gate 10, respectively.

The delay unit 30 includes two CMOS inverters I2 and I3 for delaying the output from the NAND-gate ND1, and the delay unit 40 includes two CMOS inverters I4 and I5 for delaying the output from the NAND-gate ND2.

The CMOS flip-flop 50 includes PMOS transistors PM1 and PM2 and NMOS transistors NM1 and NM2 which are connected in series between a power voltage Vcc and a ground voltage Vss. In addition, PMOS transistors PM3 and PM4 and NMOS transistors NM3 and NM4 are connected in series between the power voltage Vcc and the ground voltage Vss. The output terminal of the CMOS flip-flop 50 is commonly connected to the connection point between the PMOS transistor PM2 and the NMOS transistor NMI, and the connection point between the PMOS transistor PM4 and the NMOS transistor NM3.

The gates of the PMOS transistor PM1 and the NMOS transistor NM4 are connected with the output terminal of the CMOS inverter I3. The gates of the NMOS transistor NM2 and the PMOS transistor PM3 are connected with the output terminal of the CMOS inverter I5. The gates of the PMOS transistor PM2 and the NMOS transistor NM1 are connected with the output terminal of the NAND-gate ND1. The gates of the PMOS transistor PM4 and the NMOS transistor NM3 are connected with the output terminal of the NAND-gate ND2

The operation of the conventional address transition detection circuit will now be explained with reference to FIGS. 2A–2D.

If the chip selection signal CSb is at a low level, when a stable address signal AD as shown in FIG. 2A is inputted, an address transition detection signal ATD having a pulse width corresponding to the delay time by the delay units 30 and 40 is outputted from the CMOS flip-flop 50, as shown in FIG. 2D.

At this time, the stable address signal AD is known as an address signal AD having a pulse width wider than the address transition detection signal ATD.

Namely, if the chip selection signal CSb is at a low level, when a normal address signal AD is transited, the inputs of two NAND-gates ND1 and ND2 of the latch unit 20 has opposite phases.

The NAND-gate which receives a low level signal outputs a high level signal, and another NAND-gate which receives a high level signal outputs a low level signal.

For example, when a normal address signal AD is transited to a high level, the input of the NAND-gate ND1 becomes a high level, and the input of the NAND-gate ND2 becomes a low level As shown in FIG. 2B, the NAND-gates ND1 and ND2 output a low level signal and a high level signal, respectively.

At this time, the PMOS transistor PM2 of the CMOS flip-flop 50 is turned on by a low level signal from the NAND-gate ND1, and the NMOS transistor NM1 is turned off, and the PMOS transistor PM4 is turned off by a high level signal from the NAND-gate ND2, and the NMOS transistor NM3 is turned on.

In addition, the high and low level signals from the NAND-gates ND1 and ND2 are delayed by the delay units 30 and 40 for a predetermined time and are inputted into the CMOS flip-flop 50.

Therefore, the PMOS transistor PM1 is turned on by a low level signal as shown in FIG. 2C, delayed by and outputted from the NAND-gates ND1, and the NMOS transistor NM4 is turned off. Similarly, the NMOS transistor NM2 is turned on, and the PMOS transistor PM3 is turned off. As a result, a high level address transition detection signal ATD, as shown in FIG. 2D, is outputted from the output terminal of the CMOS flip-flop 50.

At this time, the pulse width of the address transition detection signal ATD, which is directly applied to the CMOS flip-flop 50, corresponds with an output time difference between the output signal from the latch unit 20 and the signals delayed by and outputted from the delay units 30 and 40. In other words, the pulse width of the address transition detection signal ATD corresponds with the time delayed by the delay units 30 and 40.

When a short pulse is formed in the address input signal AD due to a noise as shown in FIG. 2A, short pulses, as shown in FIGS. 2B and 2C, occur in the output signals from the NAND-gates ND1 and ND2 of the latch unit 20 and the delay units 30 and 40.

Therefore, the CMOS flip-flop 50, which is controlled by the output signals from the latch unit 20 and the delay units 30 and 40, outputs a short pulse-shaped address transition detection signal ATD as shown in FIG. 2D.

Consequently, it is impossible to obtain a stable operation of the memory device which is operated by the address transition detection signal ATD since the generated short pulse type address transition detection signal ATD becomes smaller than the minimum pulse width which is required for the memory circuit.

In other words, it is possible in the conventional art to obtain a desired address transition detection signal when an address signal having a width wider than the pulse width of the address transition detection signal is inputted. However, it is impossible to obtain a desired address transition detection signal when a short pulse signal having a width narrower than the width of the address transition detection signal, for example, due to a noise, is inputted. Thus, it is impossible to obtain a stable operation of a memory device.

SUMMARY OF THE INVENTION

Accordingly, the present invention is directed to an address transition detection circuit that substantially obviates one or more of the problems due to limitations and disadvantages of the related art.

An object of the present invention is to provide an address transition detection circuit capable of generating an address transition signal suitable for a memory device even when noise occurs in an address input signal.

Another object of the present invention is to provide an improved address transition detection circuit which is capable of enabling a stable operation of a memory circuit by generating an address transition signal which is required for operating the memory circuit even when a short pulse type of noise occurs in an address input signal.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, an address transition detection circuit of the present invention includes an address input unit, a first latch unit for latching an input address signal AD and activating an address transition detection signal ATD, a second latch unit for latching an input level of the first latch unit as a first transited value in accordance with an output from the first latch unit while the address transition detection signal ATD is active, first and second delay units for delaying an output from the first latch unit, and a CMOS flip-flop for outputting an address transition detection signal ATD having a predetermined width in accordance with outputs from the first latch unit and the delay units.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the invention, examples of which are illustrated in the accompanying drawings.

Figure 1:
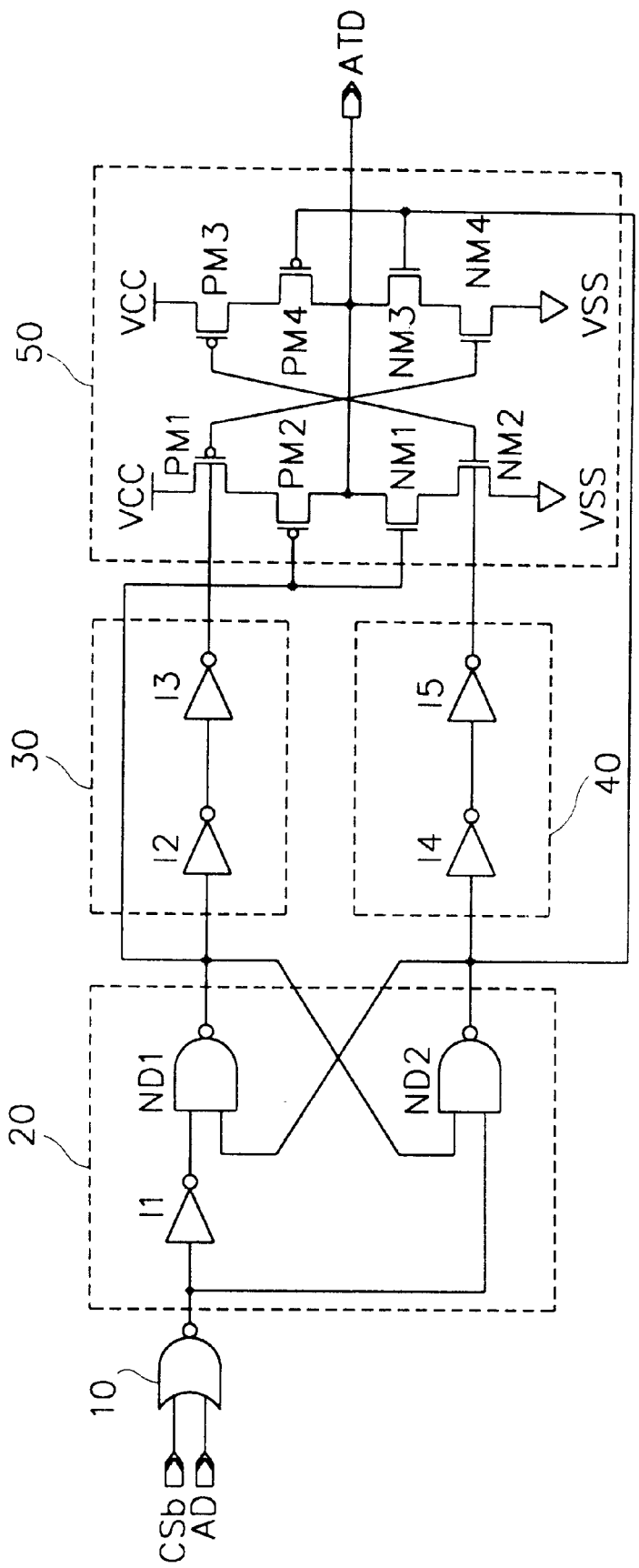
FIG. 1 is a circuit diagram illustrating a conventional address transition detection circuit.
Figure 2A:
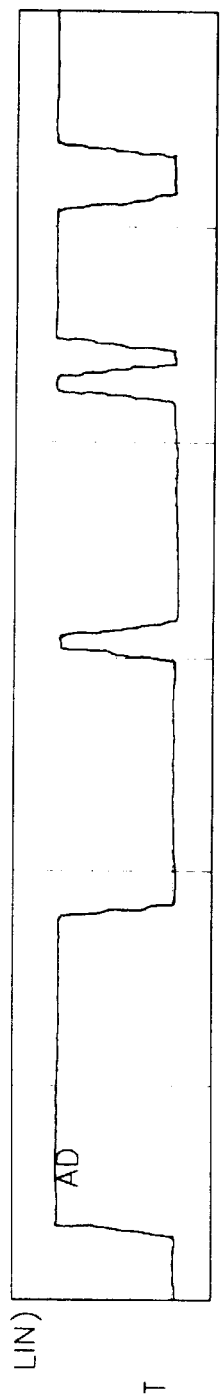
FIGS. 2A through 2D are waveform diagrams of signals from each unit in the circuit of FIG. 1.
Figure 2B:
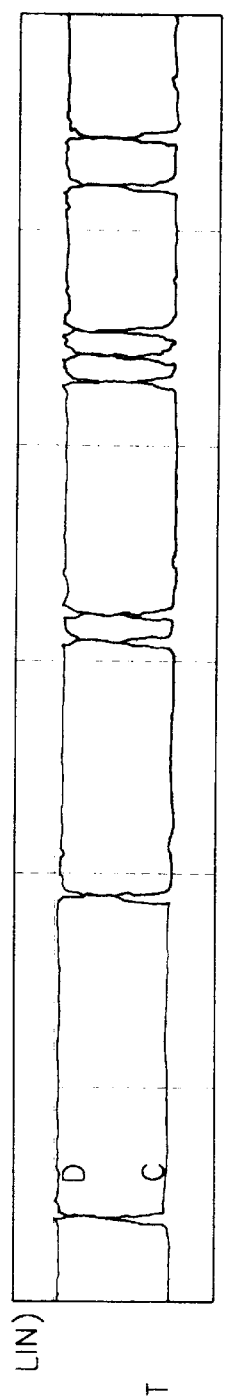
Figure 2C:
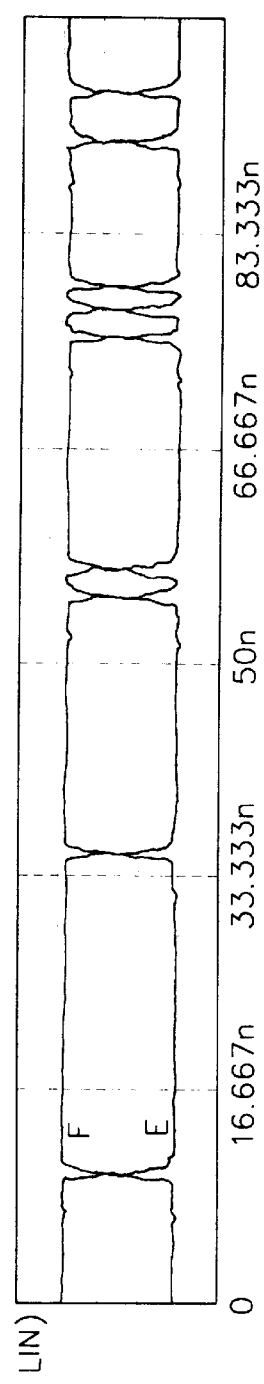
Figure 2D:
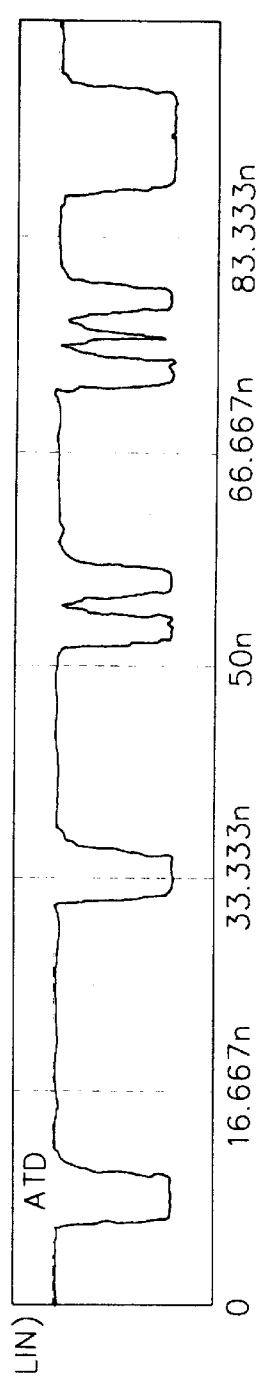
Figure 3:
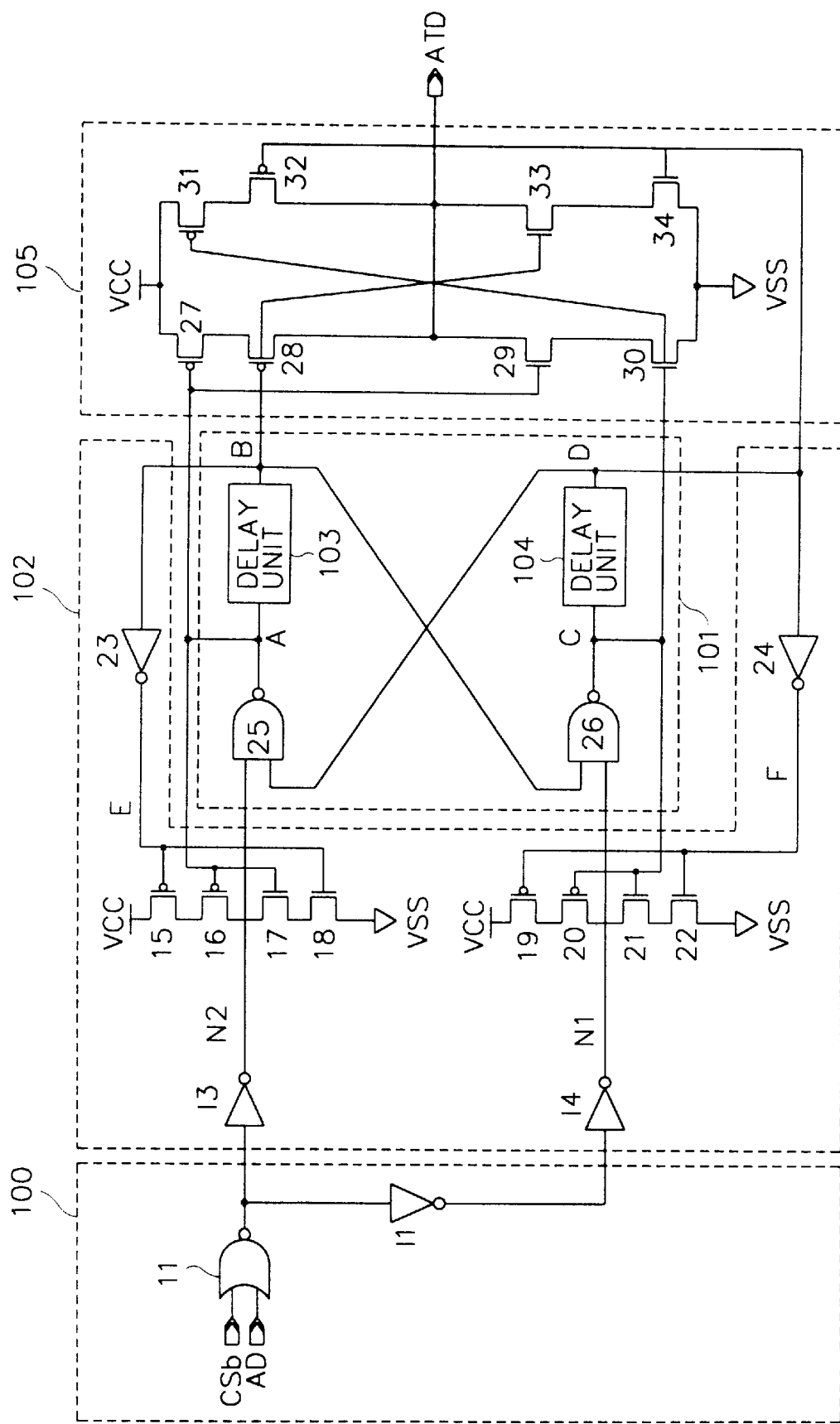
FIG. 3 is a circuit diagram illustrating an address transition detection circuit according to the present invention.

As shown in FIG. 3, the address transition detection circuit according to the present invention includes an address input unit 100, and a latch unit 101 for latching an input address signal AD and activating an address transition detection signal ATD. In addition, a feedback circuit 102 maintains an input logic level of the latch unit 101 even when the input address AD is changed while the address transition detection signal ATD is active. The latch unit 101 includes delay units 103 and 104. A CMOS flip-flop 105 outputs the address transition detection signal ATD in accordance with the outputs from the feedback circuit 102 and the delay units 103 and 104.

The address input unit 100 includes a NOR-gate 11 for operating on an address signal AD and a chip selection signal CSb, and an inverter 12 for inverting the output from the NOR-gate 11. The latch unit 101 includes two NAND-gates 25 and 26, each with an input terminal connected to the output terminals of inverters 13 and 14, respectively. The latch unit 101 also include two delay units 103 and 104 for delaying the outputs from the NAND-gates 25 and 26, respectively.

The feedback circuit 102 includes the inverters 13 and 14 for inverting the output from the address input unit 100. In addition, PMOS transistors 15 and 16 and NMOS transistors 17 and 18 are connected in series between a power voltage Vcc terminal and a ground voltage Vss terminal for latching an input level of the NAND-gate 25 in accordance with an output from the NAND-gate 25. PMOS transistors 19 and 20 and NMOS transistors 21 and 22 are connected in series between the power voltage Vcc terminal and the ground voltage Vss terminal for latching an input level of the NAND-gate 26 in accordance with an output from the NAND-gate 26. An inverter 23 inverts a delayed output from the NAND-gate 25 and outputs the inverted output to the gates of the PMOS transistor 15 and the NMOS transistor 18, respectively. An inverter 24 inverts a delayed output from the NAND-gate 26 and outputs the inverted output to the gates of the PMOS transistor 19 and the NMOS transistors 22, respectively.

At this time, the input terminal of the NAND-gate 25 is commonly connected with the output terminal of the inverter 13 and the source-drain contact between the PMOS transistor 16 and the NMOS transistor 17. The output terminal of the NAND-gate 25 is connected with the gates of the PMOS transistor 16 and the NMOS transistor 17, respectively.

In addition, the input terminal of the NAND-gate 26 is commonly connected with the output terminal of the inverter 14 and the source-drain contact between the PMOS transistor 20 and the NMOS transistor 21. The output terminal of the NAND-gate 26 is connected with the gates of the PMOS transistor 20 and the NMOS transistor 21, respectively.

The delay units 103 and 104 each includes a CMOS inverter for delaying the outputs from the NAND-gates 25 and 26 and outputting the delayed outputs to the inverters 23 and 24.

The CMOS flip-flop 105 includes PMOS transistors 27 and 28 and NMOS transistors 29 and 30 connected in series between the power voltage Vcc and the ground voltage Vss. In addition, PMOS transistors 31 and 32 and NMOS transistors 33 and 34 are connected in series between the power voltage Vcc and the ground voltage Vss.

At this time, the gates of the PMOS transistor 27 and the NMOS transistor 29 are connected with the output terminal of the NAND-gate 25. The gates of the PMOS transistor 28 and the NMOS transistor 33 are connected with the output terminal of the delay unit 103. The gates of the NMOS transistor 30 and the PMOS transistor 31 are connected with the output terminal of the NAND-gate 26. The gates of the PMOS transistor 32 and the NMOS transistor 34 are connected with the output terminal of the delay unit 104.

The operation of the address transition detection circuit according to the present invention will now be explained with reference to FIGS. 4A–4F.

When the chip selection signal CSb is at a low level, and the address signal AD is not transited, the inverters 13 and 14 have opposite logic levels.

If a logic low level is received by one of the NAND-gates (e.g., NAND-gate 25), the output signals from this NAND-gate and the corresponding delay unit of the feedback circuit 102 become a high level, and these high level signals are fed back to the input terminal of the other NAND-gate (e.g., NAND-gate 26), so that the outputs from the other NAND-gate and its corresponding delay unit of the feedback circuit 102 become a low level.

Therefore, the PMOS transistors and the NMOS transistors of the CMOS flip-flop 105 are turned on/off by the outputs from the NAND-gates 25 and 26 and delay units 103 and 104, so that a high level address detection signal ATD is outputted.

Figure 4A:
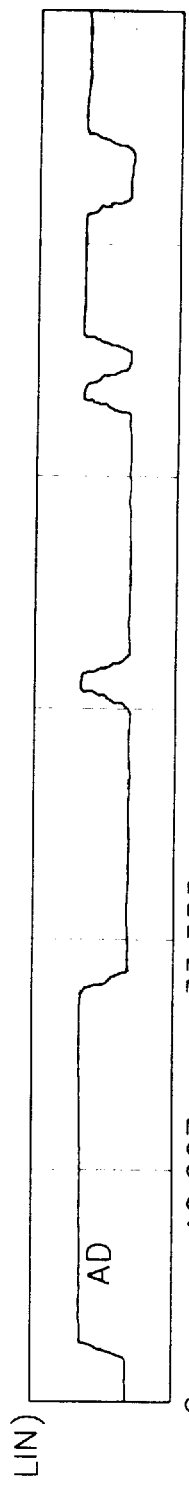
FIGS. 4A through 4F are waveform diagrams of signals from each unit in the circuit of FIG. 3.
Figure 4B:
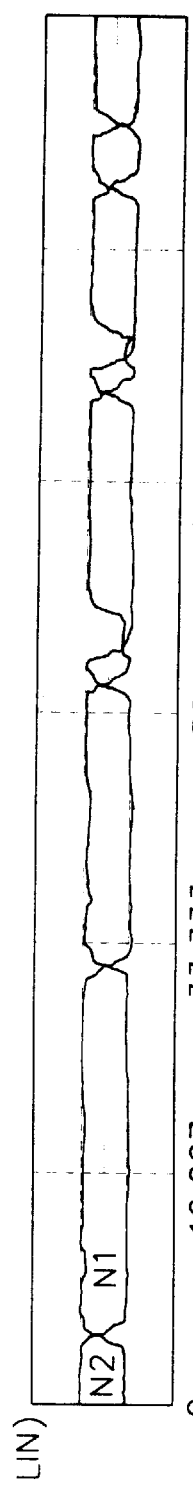

At an initial stage, assuming that a high level address signal AD is inputted through the address input unit 100, the outputs N2 and N1 from the inverters 13 and 14 become high and low levels, respectively, as shown in FIG. 4B.

Figure 4C:
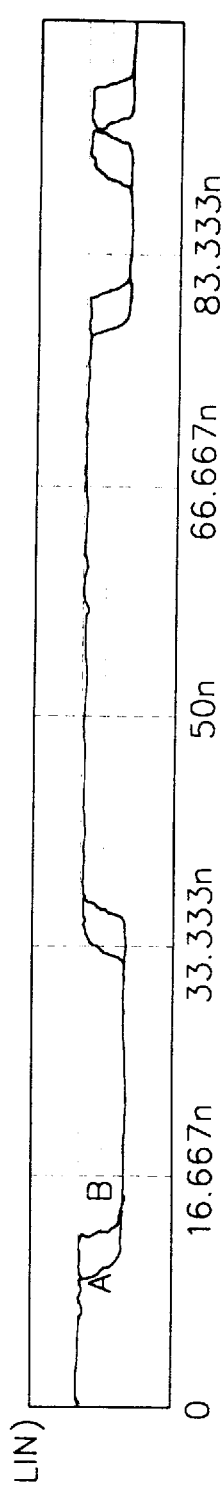
Figure 4D:
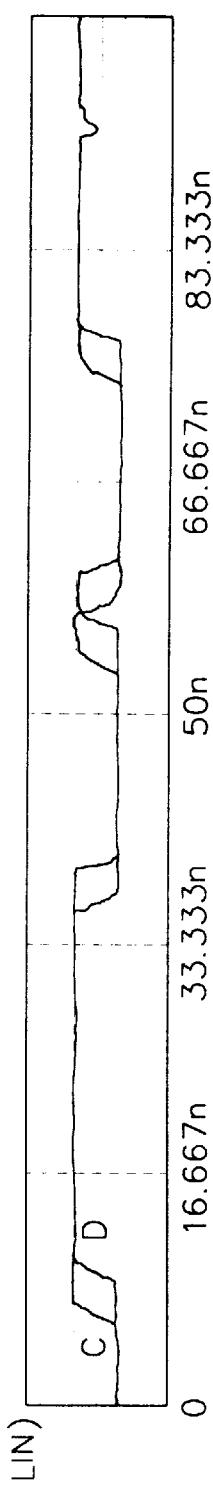
Figure 4E:
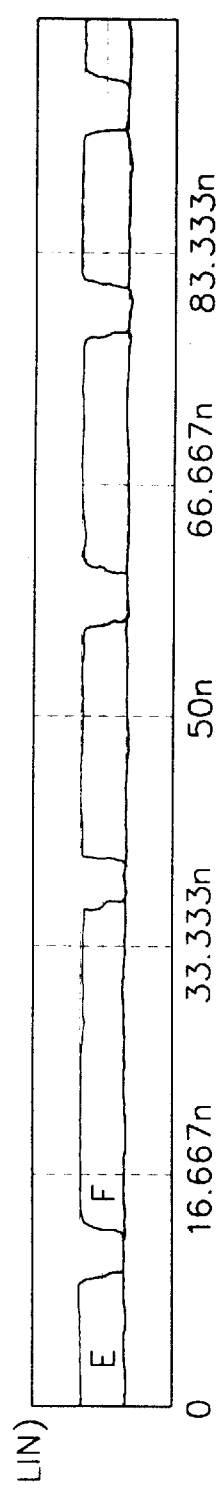

As a result of receiving the output N1 from the inverter 14, the outputs C and D from the NAND-gate 26 and the delay unit 104 change to a high level as shown in FIG. 4D. As a result of receiving the output N2 from the inverter 13, the outputs A and B from the NAND-gate 25 and the delay unit 103 change to a low level as shown in FIG. 4C.

Figure 4F:
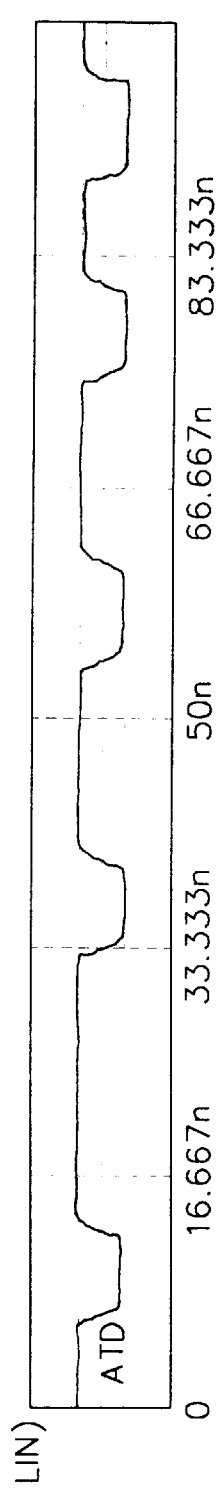

Therefore, the PMOS transistors 27 and 28 and the NMOS transistors 30 and 34 of the CMOS flip-flop 105 are turned on, and the PMOS transistors 31 and 32 and the NMOS transistors 29 and 33 are turned off, so that the address transition detection signal ATD as shown in FIG. 4F changes to a high level.

In addition, the PMOS transistor 15 and the NMOS transistor 17 are turned off by the output A from the NAND-gate outputted from the delay unit 103, and the PMOS transistor 16 and the NMOS transistor 18 are turned on.

The PMOS transistor 20 and the NMOS transistor 22 are turned off by the output C from the NAND-gate 26 and the signal F inverted by the inverter 24 and outputted from the delay unit 104, and the PMOS transistor 19 and the NMOS transistor 21 are turned on.

Namely, the transistors of the feedback circuit 102 which are used for eliminating noise are sequentially turned on and off one by one, thus blocking the power source from being supplied to the output terminals N1 and N2.

At an initial stage, if the address signal AD is at a low level, the same result as when the address signal AD is at a high level is obtained.

When the address signal AD is transited from a high level to a low level, the outputs from the inverters 13 and 14 are transited from a high level to a low level, and from a low level to a high level, respectively.

The output A from the NAND-gate 25 becomes a high level because the output N2 from the inverter 13 is transited to a low level. The PMOS transistor 27 of the CMOS flip-flop 105 is turned off by the high level output A, and the NMOS transistor 29 is turned on. Therefore, the address transition detection signal ATD becomes an active state (low level). At this time, the NMOS transistor 30 remains turned-on.

The PMOS transistor 16 of the feedback circuit 102 is turned off by the high level output A from the NAND-gate 25, and the NMOS transistor 17 is turned on, so that the output N2 is latched to a low level. At this time, the NMOS transistor 18 remains turned-on.

Thereafter, when the output A from the NAND-gate 25 is delayed by the delay unit 103 for a predetermined time, the NMOS transistor 33 of the CMOS flip-flop 105 is turned on by the output B from the delay unit 103, and the PMOS transistor 28 is turned off. The PMOS transistor 15 of the feedback circuit 102 is turned on, and the NMOS transistor 18 is turned off, thus blocking the power source from being transferred to the output terminal N2.

In addition, the output C from the NAND-gate 26 of the feedback circuit 102 becomes a low level because of the output B from the delay unit 103, and the NMOS transistor 30 of the CMOS flip-flop 105 is turned off by the low level output C. The PMOS transistor 31 is turned off, the PMOS it transistor 20 of the feedback circuit 102 is turned on, and the NMOS transistor 21 is turned off, thus latching the output N1 to a high level.

At this time, the NMOS transistor 34 of the CMOS flip-flop 105 is turned on, and the address transition detection signal ATD becomes an active state (low level).

Thereafter, when the output C from the NAND-gate 26 is delayed by the delay unit 104 for a predetermined time, since the PMOS transistor 32 of the CMOS flip-flop 105 is turned on by the output D from the delay unit 104, and the NMOS transistor 34 is turned off, the address transition detection signal ATD is transited to a high level and becomes an inactive state.

In addition, the NMOS transistor 22 of the feedback circuit 102 is turned on by the output D from the delay unit 104 supplied thereto through the inverter 24, and the PMOS transistor 19 is turned off, thus blocking the power source from being supplied to the output terminal N1.

The above-described operation applies to the case when a normal address signal AT is inputted.

However, in the present invention, even when the address signal AD is inputted in a short pulse form, the normal address transition detection signal ATD is still obtained.

When the address signal AD is transited from a high level to a low level, the address transition detection signal ATD is outputted as a pulse signal having a pulse width which is obtained based on a combined delay time of the delay units 103 and 104.

At this time, since the transistors of the feedback circuit 102 are connected with the outputs A and C from the NAND-gates 25 and 26, and performs a latching operation so that the outputs from the inverters 13 and 14 do not invert the logic level while the address transition detection signal ATD is at an active level (low level), the address transition detection signal ATD having a predetermined pulse width is outputted through the CMOS flip-flop 105.

In other words, since the outputs A and C from the NAND-gates 25 and 26 and the outputs E and F inverted by the inverters 23 and 24 and outputted from the delay units 103 and 104 maintain the logic levels at N2 and N1 as first transited value, it is possible to prevent the address transition detection signal ATD from changing due to noises.

In addition, while the address transition detection signal ATD is at an active state (logic low), even when the address signal AD is changed, since the transition of the address signal AD is neglected by the latching operation of the logic levels at N2 and N1, the address transition detection signal ATD is not affected.

Therefore, the address transition detection signal ATD has a predetermined constant pulse width, and the width of the address transition detection signal ATD is the same as the pulse width corresponding to a delayed time by the NAND-gate 25 or the NAND-gate 26 and the delay units 103 and 104

As described above, in the present invention, even when any type of address signals is inputted through the input terminals, an address transition detection signal having a constant pulse width is outputted, thus securing a stable operation of the memory circuit.

It will be apparent to those skilled in the art that various modifications and variations can be made in the address transition detection circuit of the present invention without departing from the spirit or scope of the invention. Thus, it is intended that the present invention cover the modifications and variations of this invention provided they come within the scope of the appended claims and their equivalents.

What is claimed is:

1. An address transition detection circuit, comprising:

an address input unit;

a latch unit for latching an input address signal from the address input unit and activating an address transition detection signal;

a feedback circuit for maintaining an input level of the latch unit at a first value in accordance with an output from the latch unit while the address transition detection signal is active; and a CMOS flip-flop for outputting the address transition detection signal having a predetermined width in accordance with outputs from the latch unit;

wherein the latch unit includes a first NAND-gate, a second NAND-gate, a first delay unit, and a second delay unit, an output terminal of the first NAND-gate connects with an input terminal of the first delay unit, an output terminal of the second NAND-gate connects with an input terminal of the second delay unit, an output terminal of the first delay unit connects with a first input terminal of the second NAND-gate, and an output terminal of the second delay unit connects with a first input terminal of the first NAND-gate, and wherein the feedback circuit includes:

first and second inverters each for inverting an output from the address input unit, first and second PMOS transistors and first and second NMOS transistors connected in series between a power voltage terminal and a ground voltage terminal for maintaining a logic threshold level of the first inverter, the second PMOS transistor and the first NMOS transistor being controlled by a first output from the first NAND-gate of the latch unit, third and fourth PMOS transistors and third and fourth NMOS transistors connected, series between the power voltage terminal and the ground voltage terminal for maintaining a logic threshold level of the second inverter, the fourth PMOS transistor and the third NMOS transistor being controlled by a second output from the second NAND-gate of the latch unit, a third inverter for controlling the first PMOS transistor and the second NMOS transistor in accordance with an output from the first delay unit, and a fourth inverter for controlling the third PMOS transistor and the forth NMOS transistor in accordance with an output from the second delay unit.

2. The circuit of claim 1, wherein a second input terminal of the first NAND-gate is commonly connected with an output terminal of the first inverter and a source-drain contact between the second PMOS transistor and the first NMOS transistor, and the output terminal of the first NAND-gate is connected with gates of the second PMOS transistor and the first NMOS transistor, and a second input terminal of the second NAND-gate is commonly connected with an output terminal of the second inverter and a source-drain contact between the fourth PMOS transistor and the third NMOS transistor, and the output terminal of the second NAND-gate is connected with the gates of the fourth PMOS transistor and the third NMOS transistor.

3. The circuit of claim 1, wherein a gate of the second PMOS transistor and a gate of the first NMOS transistor are connected to the first output of the first NAND-gate, thus latching an input level of the first NAND-gate in accordance an output from the first NAND-gate.

4. The circuit of claim 1, wherein a gate of the fourth PMOS transistor and a gate of the third NMOS transistor are connected to the second output of the second NAND-gate, thus latching an input level of the second NAND-gate in accordance with an output from the second NAND-gate.

5. The circuit of claim 1, wherein a width of the address transition detection signal is obtained based on a pulse width corresponding to a combined delay time of the first and second delay units.

6. The circuit of claim 1, wherein the CMOS flip-flop includes first and second PMOS transistors and first and second NMOS transistors connected in series between the power voltage terminal and the ground voltage terminal, and third and fourth PMOS transistors and third and fourth NMOS transistors connected in series between the power voltage terminal and the ground voltage terminal, wherein gates of the first PMOS transistor and the first NMOS transistor are connected with the output terminal of the first NAND-gate, gates of the second PMOS transistor and the third NMOS transistor are connected with the output terminal of the first delay unit, gates of the second NMOS transistor and the third PMOS transistor are connected with the output terminal of the second NAND-gate, and gates of the fourth PMOS transistor and the fourth NMOS transistor are connected with the output terminal of the second delay unit.

7. The circuit of claim 1, wherein the address input unit includes a NOR-gate for operating on the input address signal and a chip selection signal, and a first inverter for inverting an output from the NOR-gate.

8. The circuit of claim 1, wherein the first delay unit includes a CMOS inverter.

9. The circuit of claim 1, wherein the second delay unit includes a CMOS inverter.

10. The circuit of claim 1, wherein the address transition detection signal maintains a constant pulse width when the input address signal is in a short pulse form due to noise.

* * * * *